United States Patent [19]

Kiely et al.

[11] Patent Number: 5,748,661

[45] Date of Patent: May 5, 1998

[54] INTEGRATED LATERAL DETECTOR AND LASER DEVICE AND METHOD OF FABRICATION

[75] Inventors: Philip Kiely; Paul Claisse, both of Gilbert; Benjamin W. Gable, Chandler, all of Ariz.

[73] Assignee: Motorola, Inc., Schaumburg, Ill.

[21] Appl. No.: 684,203

[22] Filed: Jul. 19, 1996

[51] Int. Cl.$^6$ .................................. H01S 3/19; H01S 3/10
[52] U.S. Cl. .................................. 372/50; 372/29
[58] Field of Search .................. 372/50, 92, 96, 372/29, 31, 33

[56] References Cited

U.S. PATENT DOCUMENTS 5,577,064  11/1996  Swirhun et al. ..................... 372/96

*Primary Examiner*—James W. Davie
*Attorney, Agent, or Firm*—Eugene A. Parsons

[57] ABSTRACT

A method of biasing a semiconductor laser to a threshold level including the step of providing a semiconductor laser, monitoring spontaneous emissions of the semiconductor laser, identifying a point at which the spontaneous emissions clamp, and employing feedback to maintain a threshold level, driven by the identification of the point at which the spontaneous emissions clamp.

15 Claims, 3 Drawing Sheets

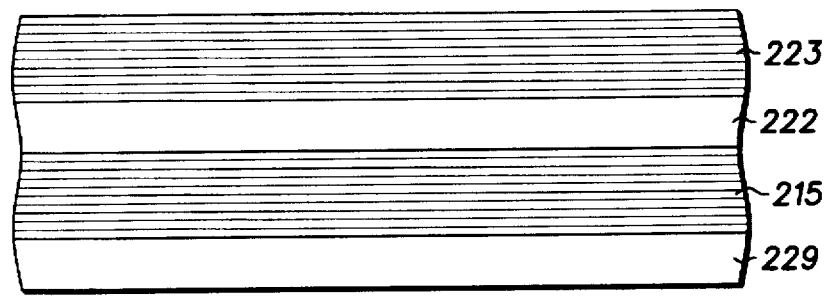
FIG. 8
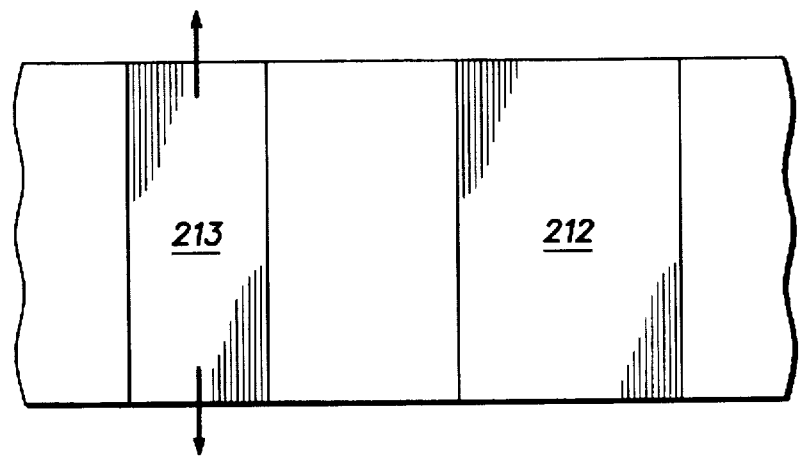
FIG. 9
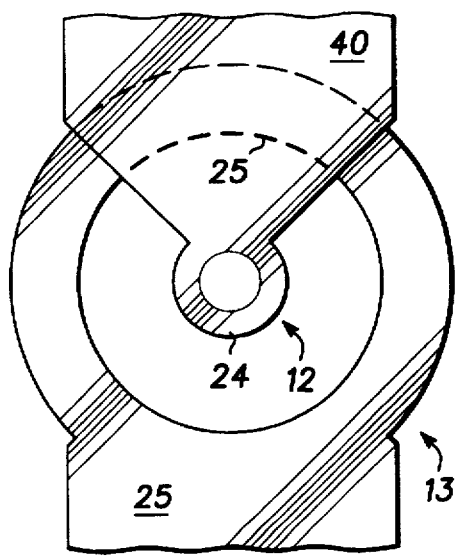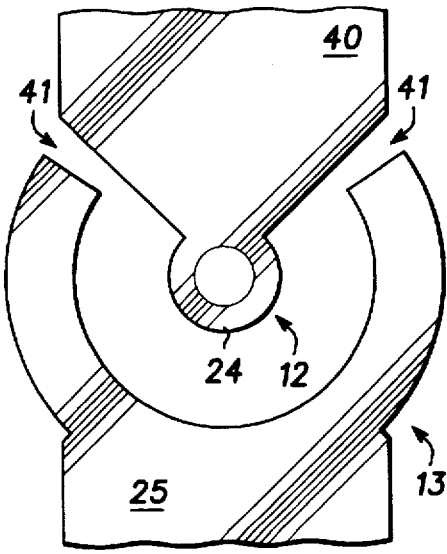
FIG. 10      FIG. 11

INTEGRATED LATERAL DETECTOR AND LASER DEVICE AND METHOD OF FABRICATION

FIELD OF THE INVENTION

This invention relates to laser devices, and more specifically to monitoring and controlling the operation of the laser devices.

BACKGROUND OF THE INVENTION

Vertical cavity surface emitting lasers (VCSEL) are well known, and are formed in a wide variety of configurations. However, the basis for the laser in virtually all configurations is an active area sandwiched between two mirror stacks. The laser is activated by driving an electrical current through the two mirror stacks and the active area. This is generally accomplished by placing a first electrode across the mirror stack at one end of the laser and a second electrode across the other mirror stack at the other end of the laser. One of the electrodes generally defines a central opening therethrough for the emission of light.

In operation, a threshold level of current must be forced through the active region in order for lasing to occur. The threshold level is reached when the stimulated emissions exceeds the internal losses. Upon reaching threshold, the light output rises rapidly with the current, with most of the current resulting in laser emissions. In many applications, it is necessary or highly desirable for high operating speed. The requirement that a threshold must first be reached before lasing occurs, causes a delay in the operation of a VCSEL.

Pre-biasing of the laser overcomes the lag time of reaching threshold. The problem is determining the extent of the bias since the threshold level of a laser will vary substantially, due to temperature fluctuations and degradation of the device over time. Some devices have been developed employing a back facet monitor photodetector in the laser system. This approach is not simple for vertical cavity surface emitting lasers where the back facet is the substrate, which for an 850 nm laser will absorb the back facet light output. This problem has been somewhat overcome by forming a detector underneath the bottom mirror. However, this presents large problems due to the requirement for extra grown layers and the processing steps needed to contact the detector.

Currently, ring detectors are being employed in conjunction with lasers in order to monitor spontaneous output for study. The ring detector encircles a laser device to collect the lateral spontaneous emissions of the laser. The use of the detectors is for experimental purposes, and the efficiency of the coupling of the lateral spontaneous emissions into the detector is low (detector currents in the 1-2 μA range). However, in substantially any commercial semiconductor device, success may depend largely on the efficiency of this coupling in order to allow the detector current to be significantly larger than any noise which may be present. Also, the detector must be formed using conventional processes and require no additional items in order to minimize the manufacturing complexity and therefore the cost of each device.

It would be highly advantageous, therefore, to remedy the foregoing and other deficiencies inherent in the prior art.

Accordingly, it is an object of the present invention to provide a method of fabricating a semiconductor laser monolithically integrated with a lateral detector.

Another object of the invention is to provide a method of detecting the threshold of a semiconductor laser.

And another object of the invention is to provide a method of biasing a semiconductor laser close to threshold to allow high speed modulation.

SUMMARY OF THE INVENTION

Briefly, to achieve the desired objects of the instant invention in accordance with a preferred embodiment thereof, provided is a monolithically integrated semiconductor device including a semiconductor laser having an active region, and a lateral detector positioned adjacent the semiconductor laser and having an active region coextensive with the active region of the semiconductor laser. For the detector, the active region refers to the region in which light absorption takes place. An isolation region is formed in coextensive portions of the active region of the semiconductor laser and the active region of the lateral detector to separate the active region of the lateral detector from the active region of the semiconductor laser and to act as a waveguide for propagating lateral emissions from the semiconductor laser to the lateral detector.

Also provided is a method of biasing a semiconductor laser to a threshold level including the steps of providing a semiconductor laser, monitoring spontaneous emissions of the semiconductor laser, identifying a point at which the spontaneous emissions clamp, and employing feedback to maintain a threshold level, driven by the identification of the point at which the spontaneous emissions clamp.

Further provided is a method of fabricating a lateral detector and a semiconductor laser which includes forming a monolithic structure of semiconductor material, the monolithic structure including an active region sandwiched between a first region and a second region. A semiconductor laser and a lateral detector are defined in the monolithic structure by electrically isolating a first portion of the active region from a second portion of the active region and isolating a first portion of the second region from a second portion of the second region.

Isolating a first portion of the active region from a second portion of the active region further includes implanting ions to prevent carrier movement while acting as a waveguide to permit propagation of lateral emissions from the semiconductor laser to the lateral detector.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which:

FIG. 8 is a sectional view of a monolithic structure used to create the integrated edge emitting laser and lateral detector of FIG. 7;

FIG. 9 is view in top plan of the integrated edge emitting laser and lateral detector of FIG. 7; and FIG. 10 is a view in top plan similar to FIG. 3, illustrating electrical connections; and FIG. 11 is a view in top plan similar to FIG. 10, illustrating additional modifications.

DESCRIPTION OF THE PREFERRED EMBODIMENTS

Figure 1:
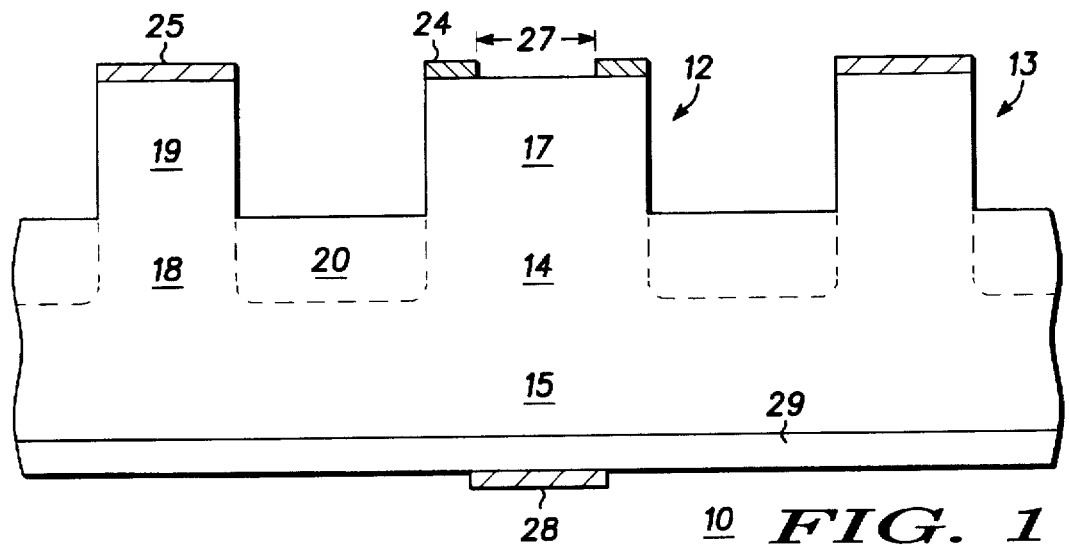
FIG. 1 is a partial sectional view of a vertical cavity surface emitting laser and lateral detector.

Turning now to the drawings in which like reference characters indicate corresponding elements throughout the several views, attention is first directed to FIG. 1 which illustrates a monolithically integrated semiconductor device generally designated 10. Device 10 includes a vertical cavity surface emitting laser (VCSEL) 12 and a monolithically integrated lateral detector 13. VCSEL 12 has an active region 14 sandwiched between a first mirror stack 15 and a second mirror stack 17. Lateral detector 13 is located adjacent VCSEL 12 and has an active region 18 sandwiched between first mirror stack 15 and a second mirror stack 19. Active region 18 is coextensive with active region 14 of VCSEL 12 with an isolation region 20 formed in coextensive portions thereof. In other words a single active region is divided by isolation region 20 into active region 18 of lateral detector 13 and active region 14 of VCSEL 12 with isolation region 20 formed in a coextensive region in between and acting as a waveguide for propagating lateral emissions from VCSEL 12 to lateral detector 13.

Figure 2:
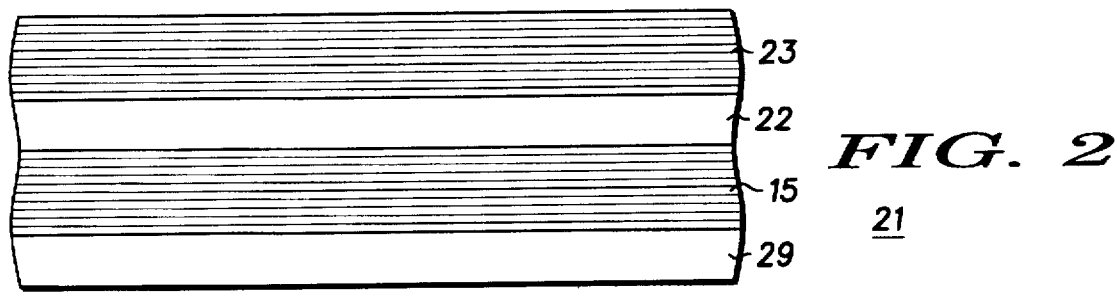
FIG. 2 is a sectional view of the monolithic structure used to create the VCSEL and detector.

Referring to FIG. 2, device 10 is fabricated by forming a monolithic structure 21 consisting of first mirror stack 15, an active region 22 overlying mirror stack 15, and a second mirror stack region 23 overlying active region 22. Active region 22 is substantially any conventional active region, and can include a first cladding layer, an active layer (such as quantum wells and the like) and a second cladding layer, these layers not being specifically shown. VCSEL 12 is defined from lateral detector 13 in monolithic structure 21 by etching second mirror stack region 23 to form second mirror stack 17 (FIG. 1) as a mesa-like structure for VCSEL 12 and second mirror stack 19 as an encircling ring for lateral detector 13.

Figure 3:
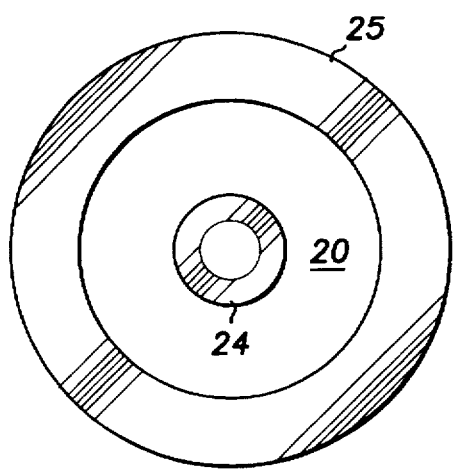
FIG. 3 is a view in top plan of the integrated vertical cavity surface emitting laser and lateral detector of FIG. 1.

With additional reference to FIG. 3, a top view of device 10 is shown to illustrate VCSEL 12 encircled by lateral detector 13. By completely encircling VCSEL 12, lateral detector 13 maximizes the amount of spontaneous emissions received and maximizes the amount of detector current generated.

Still referring to FIGS. 1 and 2, second mirror stack region 23 is etched to a depth spaced from active region. This can be accomplished in many known techniques, including providing an etch stop layer or other suitable techniques. It will be understood that second mirror stacks 17 and 19 can be formed by etching second mirror stack region 23 as described above, or can be selectively deposited.

Referring exclusively to FIG. 1, Electrical contacts 24 and 25 are formed in contact with at least the upper ends of second mirror stacks 17 and 19, respectively. In this embodiment, contacts 24 and 25 are the laser anode and detector anode respectively. Electric isolation implant 20 is a single or multi-energy implant which isolates contacts 24 and 25. In this embodiment the laser anode and detector anode are isolated at greater than 1 micro-amp. This is required to ensure that any leakage current is small compared with the current induced in the lateral detector by the spontaneous emissions. Electrical contact 24 defines a window 27 for the emission of light from VCSEL 12 through second mirror stack 17. An opposing electrical contact 28 is positioned over the lower surface of first mirror stack 15, typically on the opposing surface of a substrate 29 upon which device 10 is formed.

An operating voltage applied across contacts 24 and 28 produces a current flow through VCSEL 12 which produces the lasing action as is well known. In general, because of the position of electrical contact 24 on the surface of second mirror stack 17, current flows throughout the mesa-like structure of second mirror stack 17 and lasing is supported wherever current flows. Since current outside the optical mode is wasted and may even interfere with proper operation of the VCSEL, typically, the diametric size of the mesa is dependent upon the mode of operation of the VCSEL, with the diameter closely matching the mode of operation. Lasing generally occurs when the drive current reaches a given threshold level.

During operation, lateral detector 13 is preferably either reverse biased or left with a zero bias. When VCSEL 12 is forward biased, light is generated in active region 14. This light can propagate through electrically isolated region 20 which acts as a waveguide, directing the light to lateral detector 13. The light is absorbed by active region 18 of lateral detector 13, generating photocurrent in a known manner. The light emission is proportional to the carrier density prior to lasing. Once threshold level is reached, the quasi Fermi levels of VCSEL 12 clamp and the carrier density becomes fixed, clamping further spontaneous light emissions.

Figure 4:
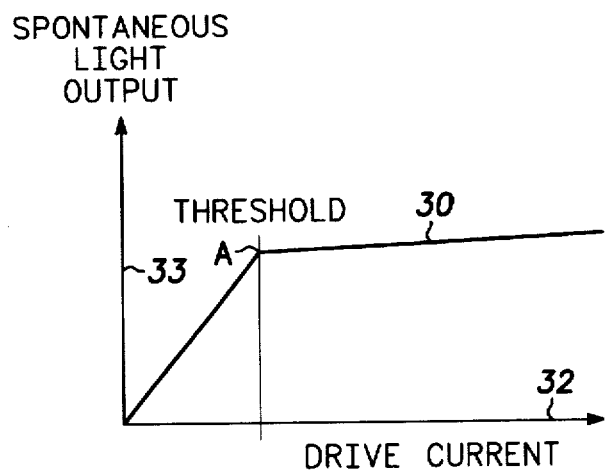
FIG. 4 is a graph illustrating the spontaneous emissions as a function of the drive current.

The expected detector current in lateral detector is illustrated in FIG. 4. Curve 30 represents the spontaneous emissions as a function of the current. Horizontal axis 32 designates current and vertical axis 33 designates the level of spontaneous emission. As can be seen, the spontaneous emissions clamp at threshold level current, resulting in an abrupt change in curve 30 at a point designated A. Subsequently, the spontaneous emissions remain substantially constant. It is the abrupt change at point A in curve 30 for which monitoring with detector 13 is employed.

Figure 5:
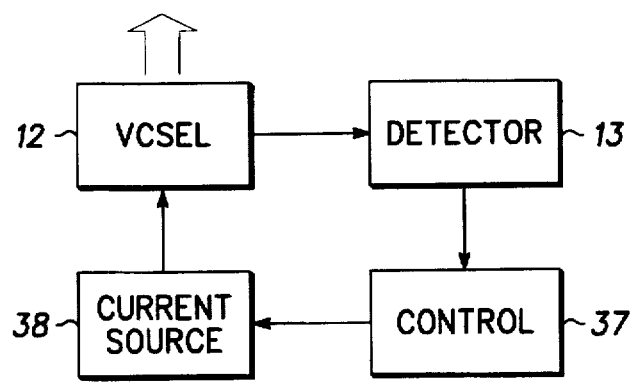
FIG. 5 is a simplified schematic of a feedback control system.

Turning now to FIG. 5, the current flow into active region 14 is controlled by employing a feedback system 35 to provide the correct current flow for maintaining VCSEL 12 at a threshold level. A control device 37 receives and processes the information monitored by lateral detector 13, and regulates the current employed to drive VCSEL 12 from a current source 38. Thus, knowledge of the point at which the spontaneous emissions clamp allows active feedback based on the detector current to bias VCSEL 12 at approximately the threshold level.

One skilled in the art will understand that this technique for determining the threshold level and biasing the laser to the threshold level can be applied to substantially any semiconductor laser in either a p-up or p-down configuration.

This is illustrated by the following embodiments.

Figure 6:
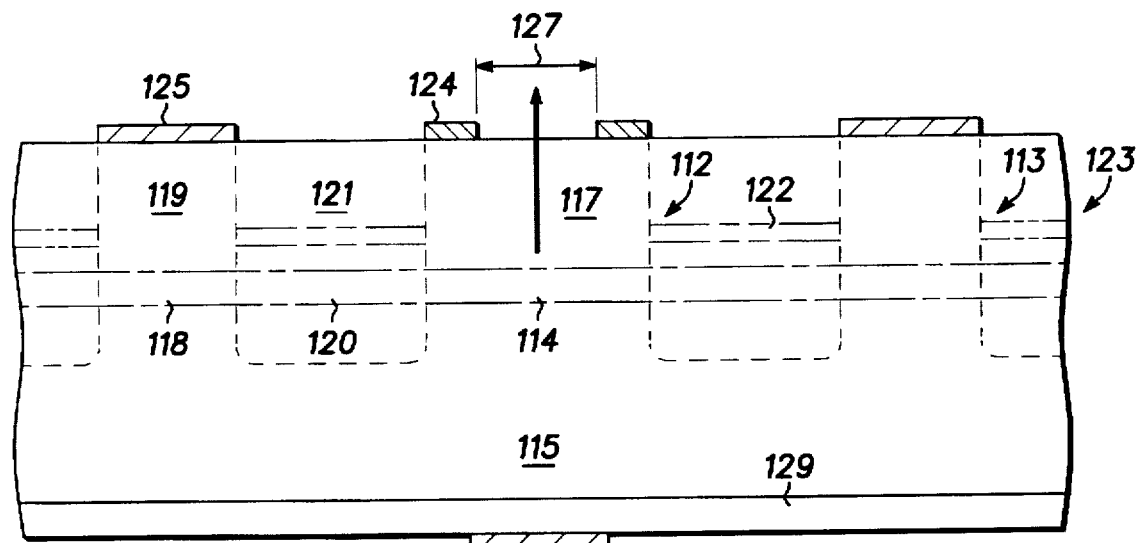
FIG. 6 is a simplified sectional view, portions thereof removed, of another embodiment in which isolation is achieved by implant alone.

Turning to FIG. 6, another embodiment of a monolithically integrated semiconductor device generally designated 110 is illustrated. Device 110 is substantially similar to device 10 in that it also includes a vertical cavity surface emitting laser (VCSEL) 112 and a monolithically integrated lateral detector 113. VCSEL 112 has an active region 114 sandwiched between a first mirror stack 115 and a second mirror stack 117. Lateral detector 113 is located adjacent VCSEL 112 and has an active region 118 sandwiched between first mirror stack 115 and a second mirror stack 119. Active region 118 is coextensive with active region 114 of VCSEL 112 with an isolation region 120 formed in coextensive portions thereof. In other words a single active region is divided by isolation region 120 into active region 118 of lateral detector 113 and active region 114 of VCSEL 112 with isolation region 120 formed in the coextensive region in between and acting as a waveguide for propagating lateral emissions from VCSEL 112 to lateral detector 113. However, in this embodiment, second mirror stacks 117 and 119 are coextensive, together making up a second mirror stack region 123. Second mirror stacks 117 and 119 are separated by an electrical isolation region 121 which extends through the portion of second mirror stack region 123 overlying the coextensive active region and isolation region 120. Isolation region 121 replaces the etched mesa-like structures of device 10, and separates VCSEL 112 from lateral detector 113.

Additionally, a current constricting region 122 can be formed in second mirror stack region 123 to control the mode of VCSEL 112. As described previously, lasing is supported wherever current flows. Since current outside the optical mode is wasted and may even interfere with proper operation of the VCSEL, typically, the second mirror stack is etched or deposited to form a mesa-like structure. The diametric size of the mesa controls the current flow and thus the mode of operation of the VCSEL. In this embodiment, the lasing area is limited by current constricting regions 122 which forces the current through a small active area by creating local highly resistive regions above active region 114.

Electrical contacts 124 and 125 are formed in contact with at least the upper ends of second mirror stacks 117 and 119, respectively. Electrical contact 124 defines a window 127 for the emission of light from VCSEL 112 through second mirror stack 117. An opposing electrical contact 128 is positioned over the lower surface of first mirror stack 115, typically on the opposing surface of a substrate 129 upon which device 110 is formed.

Figure 7:
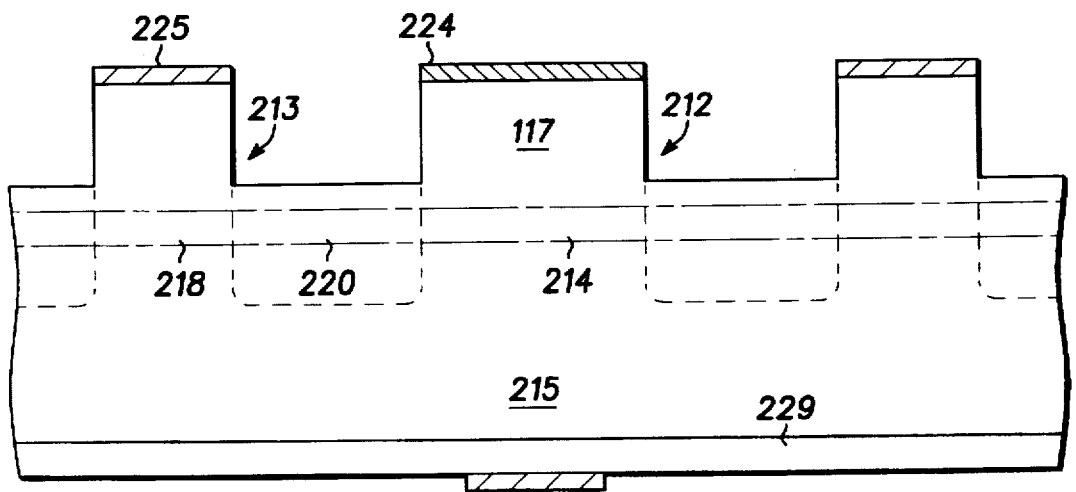
FIG. 7 is a simplified sectional view, portions thereof removed, of an edge emitting laser and lateral detector.

Referring now to FIG. 7, yet another embodiment of a monolithically integrated semiconductor device generally designated 210 is illustrated. Device 210 includes an edge emitting laser 212 and a monolithically integrated lateral detector 213. Edge emitting laser 212 has an active region 214 sandwiched between a first cladding layer 215 and a second cladding layer 217. Lateral detector 213 is located adjacent edge emitting laser 212 and has an active region 218 sandwiched between first cladding layer 215 and a second cladding layer 219. Active region 218 is coextensive with active region 214 of edge emitting laser 212 with an isolation region 220 formed in coextensive portions thereof. In other words a single active region is divided by isolation region 220 into active region 218 of lateral detector 213 and active region 214 of edge emitting laser 212 with isolation region 220 formed in a coextensive region in between and acting as a waveguide for propagating lateral emissions from edge emitting laser 212 to lateral detector 213.

Referring to FIG. 8, device 210 is fabricated by forming a monolithic structure 221 consisting of first cladding layer 215, an active region 222 overlying cladding layer 215, and a second cladding layer region 223 overlying active region 222. Active region 222 is substantially any conventional active region, and can include a first cladding layer, an active layer (such as quantum wells and the like) and a second cladding layer, these layers not being specifically shown. Edge emitting laser 212 is defined from lateral detector 213 in monolithic structure 221 by etching second cladding layer region 223 to form second cladding layer 217 (FIG. 7) as a mesa-like structure for edge emitting laser 12 and second cladding layer 219 as a mesa-like structure for lateral detector 213.

With additional reference to FIG. 9, a top view of device 210 is shown to illustrate lateral detector 213 extending the entire length of edge emitting laser 212. By extending the length of edge emitting laser 212, lateral detector 213 maximizes the amount of spontaneous emissions received and maximizes the amount of detector current generated. To further maximize detection of spontaneous emissions, a second lateral detector on the opposing side of the edge emitting laser can be fabricated employing the above described method. Furthermore, it should be noted that this technique can be employed for substantially any edge emitting laser in either a p-up or p-down configuration.

Still referring to FIGS. 7 and 8, second cladding layer region 223 is etched to a point spaced from active region 222. This can be accomplished in many known techniques, including providing an etch stop layer or other suitable techniques. It will be understood that second cladding layers 217 and 219 can be formed by etching second cladding layer region 223 as described above, or can be selectively deposited.

Referring exclusively to FIG. 7, Electrical contacts 224 and 225 are formed in contact with at least the upper ends of second cladding layers 217 and 219, respectively. An opposing electrical contact 228 is positioned over the lower surface of first cladding layer 215, typically on the opposing surface of a substrate 229 upon which device 210 is formed.

Semiconductor lasers generate spontaneous emissions that can be detected by lateral detectors. By monitoring the spontaneous emissions from semiconductor laser, as described above., the threshold level of the laser can be determined. This is highly desirable because the signal from the lateral detector indicating threshold level can be used to pre-bias the semiconductor laser to insure substantially zero laser turn on delay. This is very important in high speed optical transmission systems. Furthermore, while a device may begin life with a rated threshold, temperature variations and degradation of the device over time will cause the threshold to vary. Continuously monitoring the threshold level insures an accurate determination of the threshold current required. Another benefit is that the end of the lifetime of the device can be accurately forecast, thus preparing a user for required replacement.

While the lateral detectors described above, in conjunction with a VCSEL, are useful in monitoring the threshold of the VCSEL for biasing purposes in high speed optical transmission systems, when the detector extends completely around the VCSEL for maximizing detected light, as illustrated in FIG. 10, there is, or can be, a problem with capacitance between connecting leads. As illustrated in FIG. 10, an external connecting lead 40 is connected at the inner end to the upper contact 24 of VCSEL 12 (Generally the VCSEL anode) and extends axially outwardly across contact 25 (Generally the detector anode). While this embodiment is suitable for low speed systems and array based systems where a low speed laser-detector pair is used to set the (threshold) pre-bias for the other lasers in the array, the crossover creates a capacitance which can cause problems when high speed signals are applied to the detector being monitored.

While the capacitance can be reduced by increasing the thickness of dielectric material between contact 25 and external lead 40, and any other cross-over metals, and also by scaling the cross-over area, fabrication concerns will probably limit the reductions that can be achieved. A full solution to this problem is illustrated in FIG. 11. In this embodiment, the detector 13 does not extend completely around VCSEL 12 and contact 25 is provided with an arcuate opening or isolated region 41 therethrough. Thus, external lead 40 does not cross-over contact 25, no capacitance is produced and high speed signals can be applied to the laser without destroying the detector signal with noise. By adjusting the area of the isolated region or opening 41 and the area of external lead 40, any reduction in detected light can be minimized. This embodiment can be fabricated in a number of ways, all of which are completely manufacturable. For example, the isolated region or opening 41 can be fabricated by etch and implant techniques, or by implant only, or by other methods of semiconductor isolation in which a waveguide region is left between the laser and the detector.

Thus, a method of fabricating a semiconductor laser monolithically integrated with a lateral detector has been disclosed. Further disclosed is a device for, and method of detecting the threshold of a semiconductor laser and biasing the semiconductor laser close to threshold, to allow high speed transmission.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

What we claim is:

1. A monolithically integrated semiconductor device comprising:
   a substrate having a first mirror stack positioned thereon, an active region positioned on the first mirror stack, and a second mirror stack positioned on the active region;
   a vertical cavity surface emitting semiconductor laser formed in the first mirror stack, the active region and the second mirror stack, a portion of the second mirror stack being removed to form a mesa defining the semiconductor laser and to define an encircling trench and shoulder;
   a lateral detector formed by the first mirror stack, the active region and the second mirror stack in the encircling shoulder and positioned to at least partially encircle the semiconductor laser and having an active region coextensive with the active region of the semiconductor laser; and
   an isolation region formed in coextensive portions of the active region in the encircling trench and including an implant that encircles the semiconductor laser, the isolation region separating the active region of the lateral detector from the active region of the semiconductor laser and acting as a waveguide for propagating lateral emissions from the semiconductor laser to the lateral detector.

2. A monolithically integrated semiconductor device as claimed in claim 1 further including the semiconductor laser having an electrical contact and the lateral detector having an electrical contact, the electrical contact of the semiconductor laser being electrically isolated from the electrical contact of the lateral detector.

3. A monolithically integrated semiconductor device as claimed in claim 2 wherein the device includes a lower mirror stack underlying the active region of the lateral detector, the active region of the semiconductor laser and the isolation region.

4. A monolithically integrated semiconductor device as claimed in claim 3 wherein the semiconductor laser is a vertical cavity surface emitting laser, and is encircled by the lateral detector.

5. A monolithically integrated semiconductor device as claimed in claim 3 wherein the vertical cavity surface emitting laser is partially encircled by the lateral detector so as to define an opening between ends of the lateral detector, and the vertical cavity surface emitting laser includes a lead connected to an upper contact of the laser and extending axially outwardly from the upper contact through the opening between ends of the lateral detector, whereby cross-over capacitance is substantially eliminated.

6. A monolithically integrated semiconductor device as claimed in claim 2 wherein the device includes a lower cladding layer underlying the active region of the lateral detector, the active region of the semiconductor laser and the isolation region.

7. A method of biasing a semiconductor laser to a threshold level comprising the steps of:
   providing a semiconductor laser;
   monitoring spontaneous emissions of the semiconductor laser;
   identifying a point at which the spontaneous emissions clamp; and
   employing feedback to maintain a threshold level, driven by the identification of the point at which the spontaneous emissions clamp.

8. A method as claimed in claim 7 wherein the step of monitoring includes providing a lateral detector positioned adjacent the semiconductor laser for receiving laterally emitted spontaneous emissions from the semiconductor laser.

9. A method as claimed in claim 8 wherein the step of providing a lateral detector and a semiconductor laser includes:
   forming a monolithic structure of semiconductor material, the monolithic structure including an active region sandwiched between a first region and a second region; and
   defining a semiconductor laser and a lateral detector in the monolithic structure by electrically isolating a first portion of the active region from a second portion of the active region and isolating a first portion of the second region from a second portion of the second region.

10. A method as claimed in claim 9 wherein the step of isolating a first portion of the active region from a second portion of the active region includes implanting ions to prevent carrier movement while acting as a waveguide to permit propagation of lateral emissions from the semiconductor laser to the lateral detector.

11. A method as claimed in claim 10 wherein the step of isolating a first portion of the second region from a second portion of the second region includes etching.

12. A method as claimed in claim 10 wherein the step of isolating a first portion of the second region from a second portion of the second region includes implanting ions in the second region.

13. A method as claimed in claim 10 wherein the step of defining a semiconductor laser and a lateral detector includes defining a vertical cavity surface emitting laser partially encircled by a lateral detector.

14. A method as claimed in claim 13 wherein the step of defining the vertical cavity surface emitting laser partially encircled by the lateral detector includes defining an opening between ends of the lateral detector, connecting a lead to an upper contact of the laser, and extending the lead axially outwardly from the upper contact through the opening between the ends of the lateral detector, whereby cross-over capacitance is substantially eliminated.

15. A monolithically integrated semiconductor device comprising:

an edge emitting semiconductor laser having a length and including an active region and an electrical contact;

a lateral detector positioned adjacent the semiconductor laser and having an active region coextensive with the active region of the semiconductor laser and an electrical contact, the electrical contact of the semiconductor laser being electrically isolated from the electrical contact of the lateral detector, the lateral detector extending the entire length of the edge emitting laser;

an isolation region formed in coextensive portions of the active region of the semiconductor laser and the active region of the lateral detector, the isolation region separating the active region of the lateral detector from the active region of the semiconductor laser and acting as a waveguide for propagating lateral emissions from the semiconductor laser to the lateral detector; and a lower cladding layer underlying the active region of the lateral detector, the active region of the semiconductor laser and the isolation region.

* * * * *